United States Patent [19]

Wernet et al.

[11] Patent Number: 5,198,316

[45] Date of Patent: Mar. 30, 1993

[54] COPOLYIMIDES, THEIR PREPARATION AND THE USE THEREOF

[75] Inventors: Wolfgang Wernet, Kobe, Japan; Joseph Berger, Basle, Switzerland

[73] Assignee: Ciba-Geigy Corporation, Ardsley, N.Y.

[21] Appl. No.: 899,401

[22] Filed: Jun. 17, 1992

Related U.S. Application Data

[62] Division of Ser. No. 744,620, Aug. 12, 1991, Pat. No. 5,145,940.

[30] Foreign Application Priority Data

Aug. 17, 1990 [CH] Switzerland ............... 2674/90

[51] Int. Cl.$^5$ ............... G03G 17/04; C08G 8/02
[52] U.S. Cl. ............... 430/32; 210/651; 428/473.5; 430/56; 528/220; 528/226; 528/229; 528/353
[58] Field of Search ............... 430/32, 56; 528/220, 528/226, 229, 353; 428/47, 35; 210/651

[56] References Cited

U.S. PATENT DOCUMENTS

| | | | |
|---|---|---|---|
| 3,667,095 | 5/1972 | Suzuki et al. | 524/323 |
| 4,629,777 | 12/1986 | Pfeifer | 528/353 |
| 4,698,295 | 10/1987 | Pfeifer et al. | 430/325 |
| 4,783,372 | 11/1988 | Pfeifer | 428/435 |
| 4,792,476 | 7/1988 | Namata et al. | 528/353 |
| 4,978,733 | 12/1990 | Khanna | 528/170 |
| 5,145,940 | 9/1992 | Wernet et al. | 528/226 |

FOREIGN PATENT DOCUMENTS 2050251 4/1971 France.
2212356 7/1974 France.

OTHER PUBLICATIONS

Chem. Abst. 71-425 185/25 (FR 2050251).
Chem. Abst. 74-74721v/43 (FR2212356).

Primary Examiner—John Kight, III
Assistant Examiner—Shelley A. Wright
Attorney, Agent, or Firm—Kevin T. Mansfield; Edward McC. Roberts

[57] ABSTRACT

Mixtures of salts of organic dicarboxylic acids and organic compounds of non-salt character, dissolved in a $C_1$-$C_4$ alkanol, can be concentrated or separated with a semipermeable membrane made from a copolyimide which contains a first aromatic diamine radical (1) and a second aromatic diamine radical (2) which carries —$SO_3M$ groups, wherein M is H$\oplus$, a mono-to trivalent metal cation or an ammonium cation. The first amine radical (1) and/or the second diamine radical (2) contains $C_1$-$C_4$ alkyl groups in both o-positions to at least one amino group. These copolyamides are also radiation-sensitive (self-crosslinking) and can be used for the production of protective layers or relief images, development being carried out in an aqueous alkaline medium.

19 Claims, No Drawings

COPOLYIMIDES, THEIR PREPARATION AND THE USE THEREOF

This is a divisional of Ser. No. 744,620 filed Aug. 12, 1991, now U.S. Pat. No. 5,145,940.

The present invention relates to aromatic polyimides of aromatic diamines (1) which are substituted in the nucleus by alkyl, and aromatic diamines (2) which carry sulfonic acid groups which may be in salt form, and aromatic tetracarboxylic acids, and to a process for their preparation. The invention further relates to material coated with said copolyimides and to the use of said copolyimides for producing protective layers or relief images or in the form of semipermeable membranes for concentrating or separating mixtures of salts of organic carboxylic acids and compounds of non-salt character.

Aromatic polyimides of benzophenonetetracarboxylic acids and aromatic mononuclear or binuclear diamines which may contain —$SO_3H$ groups are disclosed in DE-A-1 962 588. The polyimides are only soluble in phenolic solvents and can be used for the preparation of coating compositions.

In EP-A-0 132 221, EP-A-0 162 017 and 0 181 837 there are disclosed aromatic polyimides of tetracarboxylic acid which contain benzophenone groups and aromatic diamines which are substituted by alkyl groups in the ortho-positions to the amino groups, which polyimides are soluble in polar aprotic solvents are self-crosslinkable. These polyimides can be used for producing protective layers or relief images, but the development must be carried out in an organic solvent-a disadvantageous procedure from the environmental aspect.

Surprisingly, it has now been found that aromatic copolyimides of aromatic tetracarboxylic acids and tricarboxylic or aromatic tricarboxylic acids and a first aromatic diamine and a second aromatic diamine which carries —$SO_3H$— groups in salt form, said first and/or said second diamine being $C_1$–$C_4$alkyl-substituted in both ortho-positions to at least one amino group, retain their light-sensitivity and are soluble not only in polar aprotic solvents but also in aqueous alkaline media. They can therefore be processed in simple manner from organic solutions to films, semipermeable membranes and protective layers. When producing relief images, development can be carried out in aqueous alkaline media.

In one of its aspects, the invention relates to copolyimides having an inherent viscosity of 0.2 to 3.0 dl/g, measured at 25° C. in a solution of 0.5% by weight of the copolyimide in N-methylpyrrolidone, and comprising A) at least one structural repeating unit of aromatic tetracarboxylic acid radicals (a) which contain 10 to 30 carbon atoms and which are unsubstituted or substituted by halogen, nitro, $C_1$–$C_4$alkyl, $C_1$–$C_4$alkoxy or phenacyl, and aromatic diamine radicals (b) which contain 6 to 30 carbon atoms and which are unsubstituted or substituted by $C_1$–$C_4$alkyl or halogen; and at least one additional optional structural repeating unit of aromatic tricarboxylic acid radicals (c) of 9 to 30 carbon atoms, which radicals are unsubstituted or substituted as for (a), and of identical or different diamine radicals (b), and B) at least one structural repeating unit of identical or different tetracarboxylic acid radicals (a) and aromatic diamines (d) which contain 6 to 30 carbon atoms and which are unsubstituted or substituted by $C_1$–$C_4$alkyl, and which contain at least one —$SO_3M$ group attached to the aromatic nucleus, wherein M is $H^\oplus$, a mono-to trivalent metal cation, $NH_4^\oplus$ or an organic ammonium cation of 1 to 30 carbon atoms; and additional optional structural repeating units of identical or different aromatic tricarboxylic acid radicals (c) and identical or different diamine radicals (d), with the proviso that at least one of said diamine radicals (b) or (d) is substituted by $C_1$–$C_4$alkyl in both ortho-positions to at least one N atom.

Preferably both ortho-positions to both N atoms are substituted by $C_1$–$C_4$alkyl. More particularly, the diamine radicals (b) or (d) are substituted by $C_1$–$C_4$alkyl in both ortho-positions of both N atoms. Most preferably, each of the diamine radicals (b) and (d) is substituted by $C_1$–$C_4$alkyl in both ortho-positions of both N atoms. $C_1$–$C_4$Alkyl may be n-, iso- or tert-butyl, n- or isopropyl and, preferably, methyl or ethyl.

The copolyimide preferably contains 5 to 95 mol %, more particularly 30 to 95 mol % and, most preferably, 50 to 95 mol %, of component (a), and 95 to 5 mol %, more particularly 5 to 70 mol % and, most preferably, 50 to 5 mol %, of component (b), based on the copolyimide.

The amount of tricarboxylic acid radicals (c) present in the copolyimide may be up to 60 mol %, preferably up to 30 mol % and, most preferably, up to 10 mol %, based on the acid radicals. Preferred copolyimides contain only radicals of tetracarboxylic acids. The inherent viscosity is preferably 0.3 to 2.0 dl/g, most preferably 0.3 to 1.5 dl/g.

The halogen substituents are preferably F, Cl and Br. The $C_1$–$C_4$alkyl and $C_1$–$C_4$alkoxy substituents are typically methyl, ethyl, n- or isopropyl or n-, iso- or tert-butyl, methoxy, ethoxy, n- or isopropoxy or n-, iso- or tert-butoxy.

The tetracarboxylic acid radicals preferably contain 10 to 24 carbon atoms, most preferably 10 to 18 carbon atoms, the tricarboxylic acid radicals preferably contain 9 to 24 carbon atoms, most preferably 9 to 18 carbon atoms, and the diamine radicals (b) and (d) preferably contain 6 to 24 carbon atoms and, most preferably, 6 to 18 carbon atoms.

M in the $SO_3M$ group as ammonium cation may be $NH_4^\oplus$ or an ammonium cation of a primary, secondary or tertiary open-chain amine containing preferably 1 to 24, most preferably 1 to 16, carbon atoms, or an ammonium cation of a monocyclic or bicyclic secondary or tertiary amine or of a tricyclic tertiary amine containing preferably 4 to 12 carbon atoms.

M as a metal cation can be a mono- to trivalent cation of metals of the main groups and subgroups, of the transition metals and of the noble metals. Mono- or divalent cations are preferred. Typical examples of metals are: Li, Na, K, Rb, Cs, Mg, Ca, Sr, Ba, In, Sn, Pb, Cu, Ag, Au, Zn, Cd, Hg, Cr, Mo, Mn, Fe, Co, Ni, Rn, Rh, Pd, Ir, Pt, Sb, Bi, as well as the group of the rare earth metals. Preferred metals are the alkaline and alkaline earth metals, Cu, Ag, Au, Fe, Co, Ni, Zn, Cd and Mn.

In a preferred embodiment of the invention, M is $H^\oplus$, $NH_4^\oplus$, an alkali metal cation or a primary, secondary, tertiary or quaternary ammonium cation of 1 to 24 carbon atoms.

Illustrative examples of tri- and tetracarboxylic acids and diamines from which the radicals are derived are described, inter alia, in EP-A-0 132 221, EP-A-0 162 017 and EP-A-0 181 837. Aromatic diamines containing —SO₃M groups are known in dyestuff chemistry and some are commercially available.

Preferred copolyimides of this invention comprise
a) structural units of formula I

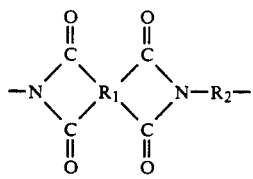

and additional optional structural units of formula II

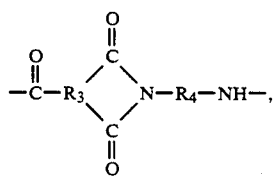

and
b) structural units of formula III

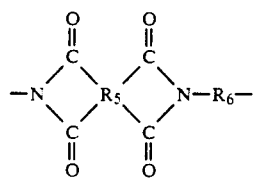

and additional optional structural units of formula IV

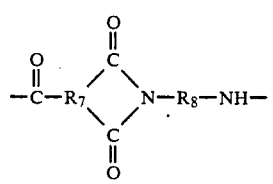

wherein
$R_1$ and $R_5$ are each independently of the other an unsubstituted or substituted tetravalent aromatic radical of 6 to 20 carbon atoms, to which two of the carbonyl groups in ortho- or peri-position are attached, $R_3$ and $R_7$ are each independently of the other an unsubstituted or substituted trivalent aromatic radical of 6 to 20 carbon atoms, to which two carbonyl groups in ortho- or peri-position are attached, $R_2$ and $R_4$ are each independently of the other a divalent aromatic hydrocarbon radical of 6 to 20 carbon atoms which is unsubstituted or substituted by $C_1$-$C_4$alkyl or halogen and $R_6$ and $R_8$ are each independently of the other a divalent aromatic hydrocarbon radical of 6 to 20 carbon atoms which is unsubstituted or substituted by $C_1$-$C_4$alkyl and which contains at least one —SO₃M group, wherein M is H⊕, a mono- to trivalent metal cation, NH₄⊕ or an organic ammonium cation of 1 to 30 carbon atoms, with the proviso that the radicals $R_2$ and $R_4$ and/or the radicals $R_6$ and $R_8$ are substituted by $C_1$-$C_4$alkyl in both ortho-positions to at least one N atom.

Preferred copolyimides are those wherein $R_1$ and $R_5$ are each independently of the other radicals of formula

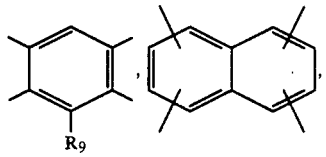

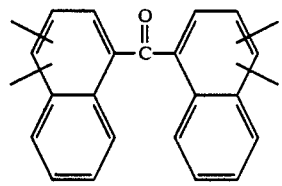

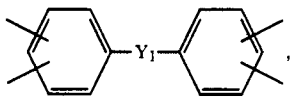

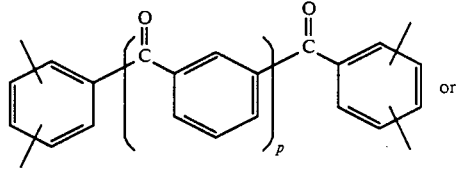

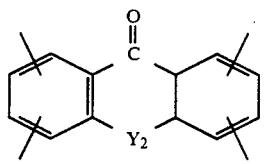

wherein two bonds are in ortho-position to each other, $R_9$ is H or phenacyl, $Y_1$ is a direct bond, —CH₂—, —CH(CH₃)—, —C(CH₃)₂—, —O—, —S—, —SO—, —SO₂—, —C(O)O— or —NR₁₀—, p is 0 or 1, $Y_2$ is —CH₂—, —CH(CH₃)—, —C(CH₃)₂—, —O—, —S—, —SO—, —SO₂—, —CO— or —NR₁₀—, and $R_{10}$ is H or $C_1$-$C_6$alkyl.

Particularly preferred copolyimides are those wherein $R_1$ and $R_5$ are each independently of the other radicals of formula

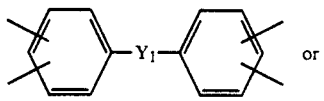

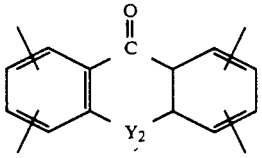

wherein two bonds are in ortho-position to each other, $Y_1$ is a direct bond, $-CH_2-$, $-O-$, $-S-$ or $-SO_2-$, and $Y_2$ is a direct bond, $-O-$, $-S-$ or $-CO-$.

In particular, $R_1$ and $R_5$ are tetravalent radicals of pyrromellitic acid, benzophenonetetracarboxylic acid and thioxanthonetetracarboxylic acid.

$R_3$ and $R_7$ are preferably each independently of the other radicals of formula

wherein two bonds are attached in ortho-position to each other, and $Y_3$ is a direct bond, $-S-$, $-OH-$, $-CH_2-$ or $-CO-$.

In a further preferred embodiment of the invention, the tetracarboxylic acid radicals $R_1$ and $R_5$ and the tricarboxylic acid radicals $R_3$ and $R_7$ contain a benzophenone group.

The radicals $R_2$, $R_4$, $R_6$ and $R_8$ are preferably a phenylene, naphthylene or an unbridged or bridged biphenylene radical.

In preferred copolyimides of the invention, $R_2$ and $R_4$ are each independently of the other an unsubstituted or a chloro-, bromo- or $C_1$-$C_4$alkyl-substituted radical of formulae

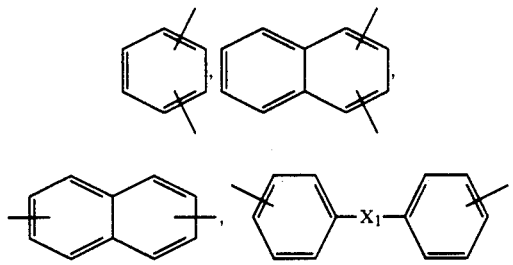

wherein
$X_1$ is a direct bond, $-CH_2-$, $-(CH_2)_2-$, $-HC=CH-$, $CH_3CH<$, $(CH_3)_2C<$, $-NR_{10}-$, $-N=N-$, $-CO-$, $-O-$, $-S-$, $-SO-$ or $-SO_2$, and $R_{10}$ is H or $C_1$-$C_6$alkyl, and
$R_6$ and $R_8$ each independently of the other a radical of formulae

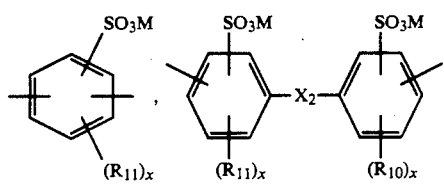

wherein $X_2$ independently has the same meaning as $X_1$, $R_{11}$ is $C_1$-$C_4$alkyl, x is 0, 1, 2 or 3, and M is $H^\oplus$, $NH_4^\oplus$, an alkali metal cation or a primary, secondary, tertiary or quaternary ammonium cation of 1 to 24 carbon atoms.

Especially preferred copolyimides are those comprising structural units of formulae I and III, and $X_1$ and $X_2$ are each independently of the other a direct bond, $-CH_2-$, $-CH=CH-$, $-CO-$, $-O-$ or $-S-$.

A particularly preferred group of copolyimides is that comprising structural units of formula I and III, wherein $R_1$ and $R_5$ are each independently of the other a tetravalent radical of the benzene series which is unsubstituted or substituted by phenacyl, $-NO_2-$, $-Cl$ or $-Br$, or a radical of formula

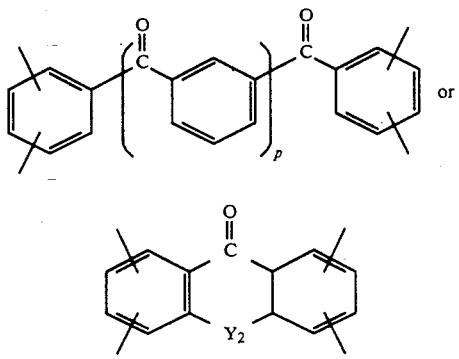

wherein p is 0 or 1 and $Y_2$ is a direct bond, $-CH_2-$, $-S-$, $-O-$ or $-CO-$, $R_2$ in both ortho-positions to at least one amino group is methyl- and/or ethyl-substituted 1,3- or 1,4-phenylene, or in both o-positions to the amino groups is methyl- and/or ethyl-substituted 3,3'- or 4,4'-diphenylmethanediyl, and $R_6$ is a radical of formulae

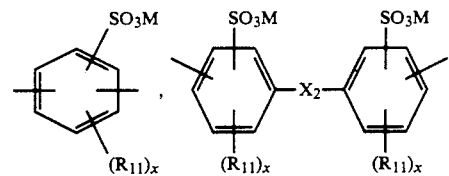

wherein $X_2$ is a direct bond, $-CH=CH-$ or $-CH_2-$, $R_{11}$ is methyl and/or ethyl, x is 0, 1, 2 or 3, and M is $H^\oplus$, $NH_4^\oplus$, $Li^\oplus$, $Na^\oplus$, $K^\oplus$, $Rb^\oplus$, $Cs^\oplus$, primary, secondary, tertiary or quaternary ammonium of 1 to 20 carbon atoms.

The most preferred copolyamides are those wherein $R_6$ is a radical of formula

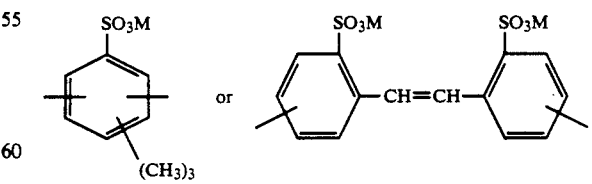

wherein M is $H^\oplus$, $NH_4^\oplus$, $Li^\oplus$, $Na^\oplus$, $K^\oplus$, $Rb^\oplus$, $Cs^\oplus$, tertiary or quaternary ammonium of 4 to 20 carbon atoms.

The invention further relates to a process for the preparation of copolyimides according to claim 1, which comprises A) reacting and cyclising at least one tetracarboxylic acid (a') of 10 to 30 carbon atoms, which is unsubstituted or substituted by halogen, nitro, $C_1$–$C_4$alkyl, $C_1$–$C_4$alkoxy or phenacyl, and at least one optional aromatic tricarboxylic acid (c') of 9 to 30 carbon atoms, which is unsubstituted or saubstituted as for (a'), or a polyamide forming derivative thereof, B) with at least one aromatic diamine (b') of 6 to 30 carbon atoms, which is unsubstituted or substituted by $C_1$–$C_4$alkyl or halogen, and with at least one aromatic diamine (d') of 6 to 30 carbon atoms, which is unsubstituted or substituted by $C_1$–$C_4$alkyl, and which contains at least one —$SO_3M$ group attached to the aromatic nucleus, with the proviso that at least one of said diamines (b') or (d') is substituted by $C_1$–$C_4$alkyl in both ortho-positions to at least one amino group.

Acid derivatives are typically anhydrides, esters, amides and halides, preferably chlorides. The monomers used in the process are known and some are commercially available or can be prepared by known processes.

The preparation of the polyimides is preferably carried out in solution. Suitable inert solvents are listed below. The reaction temperatures may be in the rnage from $-20°$ to $300°$ C.

The procedure is conveniently such that the tetracarboxylic dianhydride and the diamine are reacted first to form a polyamic acid precursor, which is then cyclised, with elimination of water. The cyclisation may be carried out under heat. It is convenient to carry out the cyclisation using condensing agents such as carboxylic anhydrides, typically acetic anhydride. The polyimides can then be isolated by customary methods, for example by removal of the solvent or precipitation by addition of a non-solvent.

A further process consists in reacting the tetracarboxylic anhydride with a diisocyanate in one step to the polyimide.

From the novel copolyimides it is possible to prepare semipermeable membranes with which, surprisingly, mixtures of organic compounds can be separated or individual constituents concentrated.

In another of its aspects, the invention relates to a process for concentrating or separating salts of organic carboxylic acids from organic compounds of non-salt character with the aid of semipermeable membranes, which process comprises contacting a solution of the salts and organic compounds in an unsubstituted or $C_1$–$C_3$alkoxy-substituted $C_1$–$C_4$alkanol, mixtures of such alkanols or mixtures of such alkanols with ethers, with one side of the membrane, the pure solvent being present on the other side of the membrane, and said membrane is made from a copolyimide, and to the use of novel copolyimides in the form of semipermeable membranes for concentrating or separating salts of organic carboxylic acids from organic compounds of non-salt character.

The concentration of the salts and organic compounds is preferably 0.0001 to 10 percent by weight, more particularly 0.001 to 5 percent by weight and, most preferably, 0.001 to 3 percent by weight.

The thickness of the membrane may be from 5 to 300 μm, preferably from 20 to 200 μm.

The alkanol used as solvent contains 1 to 4, and, preferably, 1 to 3, carbon atoms. It may be substituted by methoxy or ethoxy. Representative examples of such alkanols are: methanol, ethanol, n- and isopropanol, n-, iso- and tert-butanol, methoxyethanol, ethoxyethanol, propoxyethanol, 1-methoxypropan-3-ol, 2-methoxypropan-1-ol. Preferred solvents are methanol, ethanol, 1- or 2-propanol and 2-methoxyethanol. It is also possible to use mixtures of the alkanols with one another or with ethers, such as diethyl ether or ethylene glycol dimethyl ether.

The salt of the organic carboxylic acid may be an ammonium or a metal salt, such as $NH_4^\oplus$, an ammonium cation of a primary, secondary or tertiary amine containing a total of 1 to 20 carbon atoms, an alkali metal salt or an alkaline earth metal salt. Alkali metal salts and ammonium salts are preferred. $NH_4^\oplus$ and $Li^\oplus$ salts are most preferred.

The organic carboxylic acid may be selected from mono-, di-, tri-or tetracarboxylic acids. Aliphatic, cycloaliphatic, aromatic and heterocyclic or heteroaromatic monocarboxylic acids which contain 1 to 18, preferably 1 to 12, carbon atoms, are preferred.

In a preferred embodiment of the invention, the organic acid has the formula (A)

$$R_a\text{—}X\text{—}COOH \qquad (A)$$

wherein X is a direct bond, $C_1$–$C_4$alkylene, $C_2$–$C_4$alkylidene or $C_2$–$C_4$alkenylene, $R_3$ is H, $C_1$–$C_{12}$alkyl, $C_2$–$C_{12}$alkenyl, $C_2$–$C_{12}$alkynyl, $C_3$–$C_{12}$cycloalkyl, $C_3$–$C_{12}$cycloalkenyl, $C_6$–$C_{16}$aryl, $C_3$–$C_{12}$heterocycloalkyl, $C_3$–$C_{12}$heterocycloalkenyl, $C_6$–$C_{16}$heteroaryl, which are unsubstituted or substituted by —OH, —SH, —CN, —$NO_2$, halogen, $C_1$–$C_6$alkyl, $C_1$–$C_6$alkoxy, $C_1$–$C_6$alkylthio, $C_1$–$C_6$alkyl—Y—, where Y is —CO—, —SO—, —$SO_2$—, —CO—O—, —O—CO—, —CO—$NR_bR_c$—, —$NR_bR_c$—CO—, and $R_b$ and $R_c$ are each independently of the other H, $C_1$–$C_6$alkyl, $C_2$–$C_4$hydroxyalkyl or $R_b$ and $R_c$, when taken together, are tetramethylene, pentamethylene or 3-oxapentyl-1,4-ene.

$R_a$ as alkyl, which may be linear or branched, is typically methyl, ethyl, n- and isopropyl, n- and isobutyl, pentyl, hexyl, heptyl, octyl, nonyl, decyl, undecyl and dodecyl.

$R_a$ as alkenyl, which may be linear or branched, is typically vinyl, crotonyl, allyl, but-1-en-1-yl, but-1-en-2-yl, but-1-en-3-yl, but-1-en-4-yl, but-2-en-1-yl, but-2-en-2-yl, but-2-en-4-yl, pentenyl, hexenyl, heptenyl, octenyl, nonenyl, decenyl, undecenyl and dodecenyl.

$R_a$ as alkynyl, which may be linear or branched, is typically ethynyl, prop-2-yn-1-yl, prop-2-yn-3-yl, butynyl, pentynyl, hexynyl, heptynyl, octynyl, decynyl and dodecynyl.

$R_a$ as cycloalkyl and cycloalkenyl preferably contains 4 to 8, most preferably 5 or 6, carbon atoms. Typical examples are cyclopropyl and cyclopropenyl, cyclobutyl and cyclobutenyl, cyclopentyl and cyclopentenyl, cyclohexyl and cyclohexenyl, cycloheptyl and cycloheptenyl, cyclooctyl and cyclooctenyl.

$R_a$ as aryl preferably contains 6 to 12 carbon atoms. Typical examples are phenyl, biphenyl and naphthyl.

$R_a$ as heterocycloalkyl and heterocycloalkenyl preferably contains 4 to 8, most preferably 4 to 6, ring carbon atoms. Preferred hetero atoms are those selected from the group consisting of O, S and $NR_d$, wherein $R_d$ is H, $C_1$–$C_6$alkyl or $C_1$–$C_7$acyl. $R_a$ as heteroaryl preferably contains 4 to 11 ring carbon atoms and, preferably, hetero atoms selected from the group consisting of O, S and —N=. Typical examples of heterocycles are pyrrolidine, tetrahydrofuran, tetrahydrothiophen, pyrroline, dihydrofuran, dihydrothiophene, indane, dihydrocoumarone, dihydrobenzothiophene, carbazole, dibenzofuran, dibenzothiophene, pyrazolidine, imidazolidine, pyrazoline, imidazoline, benzimidazolidine, oxazolidine, oxazoline, thiazolidine, thiazoline, isooxazolidine, isooxazoline, isothiazolidine, isothiazoline, benzoxazolidine, benzoisooxazolidine, benzothiazolidine, 1,2,3- or 1,2,4-triazolidine, 1,2,3- or 1,2,4-triazoline, 1,2,3- or 1,2,4-oxazolidine or -oxazoline, piperidine, di- and tetrahydropyridine, dihydro- and tetrahydropyran, di- and tetrahydrothiopyran, piperazine, dehydropiperazine, morpholine, thiomorpholine, 1,3- and 1,4-dioxan, 1,4-dithiane, azepane, 1,3-Dioxolan, 1,3-dithiolane, pyrrole, indole, imidazole, benzoimidazole, furan, thiophene, benzofuran, benzothiophene, carbazole, dibenzofuran, dibenzothiophene, oxazole, isooxazole, thiazole, isothiazole, benzoxazole, benzothiazole, pyridine, pyrimidine, pyrazine, pyridazine, quinoline, isoquinoline, acridine, chromene, chroman, pyran, thiapyran, phenazine, phenoxazine, phenolthiazine, purine.

$R_b$, $R_c$ and $R_d$ as alkyl and hydroxyalkyl may be methyl, ethyl, n- or isopropyl, n-, iso- or tert-butyl, n-pentyl, n-hexyl, 2-hydroxyethyl, 2- or 3-hydroxypropyl, 2-, 3- or 4-hydroxybutyl. $R_d$ as acyl is typically acetyl, propionyl and phenacyl.

Representative examples of X in formula A are methylene, ethylene, 1,2- or 1,3-propylene, 1,2-, 1,3- or 1,4-butylene, ethylidene, 1,1- or 2,2-propylidene, 1,1- or 2,2-butylidene, ethenylene, prop-1-en-1,3- or -1,2- or 2,3-ylene.

In a preferred embodiment of the invention, the salts are $Li^\oplus$ or $NH_4^\oplus$ salts of carboxylic acids selected from the group consisting of furan-2-carboxylic acid, benzoic acid, methylbenzoic acid, phenylacetic acid, cinnamic acid, sorbic acid or $C_2$-$C_8$-alkanecarboxylic acids.

The organic compound of non-salt character preferably contains 2 to 20, more particularly 2 to 16 and, most preferably, 2 to 12, carbon atoms. Most preferably the organic compound is an ester of an organic monocarboxylic acid containing a total of 2 to 16 carbon atoms, an ether containing 2 to 12 carbon atoms, a ketone containing 3 to 16 carbon atoms, or an alcohol containing 5 to 16 carbon atoms.

In a preferred embodiment of the invention, the organic compound is a $C_1$-$C_6$alkyl ester of furan-2-carboxylic acid, benzoic acid, methylbenzoic acid, phenylacetic acid, cinnamic acid, sorbic acid or a $C_2$-$C_8$alkanecarboxylic acid; a $C_5$-$C_{12}$alkanol or benzyl alcohol; a dialiphatic ketone of 3 to 10 carbon atoms, a $C_1$-$C_6$alkylphenyl ketone or diphenyl ketone; or a dialiphatic ether of 2 to 8 carbon atoms, a $C_1$-$C_6$alkylphenyl ether or diphenyl ether.

For carrying out the process of this invention the membrane can be of different shape and built into separating modules of conventional construction. Thus, for example, flat membranes or asymmetrical membranes can be combined to two- or multi-compartment systems. It is also possible to use tubular membranes or hollow fibres which are normally used in the form of bundles. To increase mechanical stability, the membranes can be mounted on a supporting frame. The membranes are prepared by known methods.

The process of the invention is normally carried out at room temperature. To attain a sufficient rate of flow it is advantageous to apply elevated pressure on the side of the solution. The pressure is preferably 1 to 10 MPa, most preferably 1 to 6 MPa. In a special embodiment of the invention, the process is carried out by the countercurrent principle.

The process of the invention may be used as concentration or purification process or for recovering or separating reaction components or by-products from reaction residues or reaction mixtures, or for isolating and purifying intermediates, especially when the substances in question are thermally labile.

The copolyimides of this invention are polymers having high glass transition temperatures and excellent heat stability, and they can be crosslinked direct by irradiation. They are suitable for making sheets, fibres and for coating substrates, for surface protection or for producing relief images, and the properties of the polycondensates can be modified by irradiation. The high melting aromatic copolyimides are preferably processed from solution.

The radiation sensitivity is especially high when the acid components of the copolymides contain benzophenone groups. To achieve short irradiation times it is preferred to subject copolyimides which contain such acid components to irradiation.

A preferred field of use is that of coating surfaces and producing relief images on such coated surfaces, to which utility the invention also relates. It is especially advantageous that, for attaining the desired properties, the novel copolyimides can be correspondingly adapted for specific requirements by the choice of different monomers and/or by blending different copolyimides. A further particular advantage of the novel copolyimides is their solubility in aqueous basic media, for example in aqueous solutions of alkali metal hydroxides (NaOH, KOH), or in aqueous solutions of alkali metal carbonates ($NaHCO_3$, $Na_2CO_3$, $K_2CO_3$). The invention further relates to a coated material containing on a support a layer of a novel copolyimide.

To prepare the coated material, a copolyimide or a mixture thereof is dissolved preferably in a suitable organic solvent, with or without heating. Suitable solvents are polar aprotic solvents which may be used by themselves or as mixtures of at least two solvents. Typical examples of such solvents are: ethers such as dibutyl ether, tetrahydrofuran, dioxane, ethylene glycol, dimethyl ethylene glycol, dimethyl diethylene glycol, diethyl diethylene glycol, dimethyl triethylene glycol, halogenated hydrocarbons such as methylene chloride, chloroform, 1,2-dichlorethane, 1,1,1-trichloroethane, 1,1,2,2-tetrachloroethane, carboxylates and lactones such as ethyl acetate, methyl propionate, ethyl benzoate, 2-methoxyethylacetate, γ-butyrolactone, o-valerolactone and pivalolactone, carboxamides and lactams such as formamide, acetamide, N-methylformamide, N,N-dimethylformamide, N,N-dimethylformamide, N,N-dimethylacetamide, N,N-diethylacetamide, γ-butyrolactam, ε-caprolactam, N-methylpyrrolidone, N-acetylpyrrolidone, N-methylcaprolactam, tetramethylurea, hexamethylphosphoric triamide, sulfoxides such as dimethyl sulfoxide, sulfones such as dimethyl sulfone, diethyl sulfone, trimethylene sulfone, tetramethylene sulfone, trimethylamine, triethylamine, N-methylpyrrolidine, N-methylpiperidine, N-methylmorpholine, substituted benzenes such as chlorobenzene, nitrobenzene, phenols or cresol.

Undissolved constituents can be removed by filtration, preferably pressure filtration. The concentration of polymer in the coating material obtained is preferably not more than 50% by weight, more particularly not more than 30% by weight and, most preferably, not more than 20% by weight, based on the solution. The solutions are storage-stable, but must be protected from the action of light.

During the preparation of the solutions it is possible to add further customary modifiers which do not adversely affect the light sensitivity. Typical examples of such modifiers are: delustrants, levelling agents, finely particulate fillers, flame retardants, fluorescent whitening agents, antioxidants, light stabilisers, dyes, pigments and adhesion promoters. If desired, sensitisers may also be added, typically thioxanthone derivatives or benzophenone derivatives, so as to enhance the light sensitivity still further.

The coating composition can be applied to suitable substrates and carrier materials by conventional methods such as dip coating, brushing and spraying, whirl coating, cascade coating and curtain coating. Suitable substrates include plastics, metals and metal alloys, semi-metals, semi-conductors, glass, ceramics and other inorganic materials such as $SiO_2$ and $Si_3N_4$. The solvent may subsequently be removed by heating and under vacuum. Tack-free, dry and uniform films are obtained. Depending on the use, the films may have thicknesses up to c. 500 μm and more, preferably from 0.5 to 500 μm and, most preferably, from 1 to 50 μm.

The radiation-sensitive layer in the material of this invention can be crosslinked by irradiation.

The photostructuring or photocrosslinking can be effected by high-energy radiation, typically by light, preferably in the UV range, by X-rays, laser light, electron beams and the like. The material of this invention is admirably suitable for producing protective films, passivation coatings, and as photographic recording material for heat-stable relief images.

Fields of use include protective, insulating and passivation coatings in electrotechnology and electronics, photomasks for electronics, textile printing and the graphics industry, etch resists for making printed circuits and printing plates and integrated circuits, relays for making X-ray masks, as solder varnish, as dielectric for multilayer circuits, as structural element for liquid crystal displays.

Protective films are produced by direct irradiation, the exposure times depending essentially on the layer thicknesses and the light-sensitivity.

Photographic production of the relief structure is effected by imagewise exposure through a photomask and subsequent development by removing unexposed areas with an aqueous alkaline medium, preferably an aqueous solution of an alkali metal hydroxide (NaOH, KOH) or an aqueous solution of an alkali metal carbonate ($Na_2CO_3$, $K_2CO_3$, $KHCO_3$, $NaHCO_3$), after which the image produced may be stabilised by a thermal aftertreatment.

The invention further relates to a process for producing protective coatings or relief images, which comprises irradiating the layer of the material over the surface or through a photomask and thereafter developing the image in an aqueous alkaline medium by dissolving out the unexposed areas.

The polymer layer of the material of this invention has a light-sensitivity sufficient for many end uses and in some cases is high, and it can be photocrosslinked direct. The protective films and relief images are distinguished by good adhesion and by heat resistance, mechanical strength and resistance to chemicals. Only insignificant contraction is observed in thermal aftertreatments. In addition, the use of modifiers for inducing or increasing light-sensitivity can be avoided. The material is storage stable, but must be protected from the action of light.

The invention is illustrated in more detail by the following Examples.

A) PREPARATION OF THE COPOLYMERS

Examples A1–A14

The diamines, dissolved in N-methylpyrrolidone (NMP), are charged to a 200 ml glass flask fitted with stirrer, reflux condenser, dropping funnel, drying tube and cooling bath. The solution is cooled to 5° C. and then the tetracarboxylic anhydrides are added dropwise, with efficient stirring, to give a 20% by weight solution. The solution is stirred for 4 hours at 20°–25° C. The resultant polyamic acid is cyclised by addition of triethylamine and acetic anhydride. The copolymer is precipitated in water after stirring for a further 12 hours and the precipitate is isolated by filtration, washed with methanol and dried under a high vacuum at 40° C. Further particulars are given in Table 1.

TABLE 1

| Example | Diamine 1[1] (mol %) | Diamine 2[1] (mol %) | Tetracarboxylic dianhydride | Inherent[2] viscosity (dl/g) | $T_g$[3]/$T_m$[4] (°C.) |
|---|---|---|---|---|---|
| A1 | tetramethyl-p-phenylenediamine (95) | 3,5-diamino-2,4,6-trimethylbenzene-1-sulfonic acid tetrabutylammoniumsalt (5) | 3,4,3',4'-benzophenone-tetracarboxylic dianhydride | 0.88 | —/385 |
| A2 | tetramethyl-p-phenylendiamine (80) | 3,5-diamino-2,4,6-trimethylbenzene-1-sulfonic acid tetrabutylammoniumsalt (20) | 3,4,3',4'-benzophenone-tetracarboxylic dianhydride | 0.81 | —/392 |
| A3 | tetramethyl-p-phenylendiamine (90) | 3,5-diamino-2,4,6-trimethylbenzene-1-sulfonic acid tetrabutylammoniumsalt (10) | 3,4,3',4'-benzophenone-tetracarboxylic dianhydride | 0.83 | —/— |
| A4 | tetramethyl-p-phenylendiamine (90) | 4,4'-diamino-trans-stilbene-2,2'-disulfonic acid di-tetrabutylammoniumsalt (10) | 3,4,3',4'-benzophenone-tetracarboxylic dianhydride | 0.88 | —/397 |
| A5 | 4,4'-diamino-3,3'-dimethyl-5,5'-diethyldiphenyl- | 3,5-diamino-2,4,6-trimethylbenzene-1-sulfonic acid tetra- | pyromellitic dianhydride | 0.78 | — |

TABLE 1-continued

| Example | Diamine 1[1] (mol %) | Diamine 2[1] (mol %) | Tetracarboxylic dianhydride | Inherent[2] viscosity (dl/g) | $T_g$[3]/$T_m$[4] (°C.) |
|---|---|---|---|---|---|
| | methane (80) | butylammoniumsalt (20) | | | |
| A6 | 4,4'-diamino-3,3'-dimethyl-5,5'-diethyldiphenylmethane (70) | 4,4'-diamino-trans-stilbene-2,2'-disulfonic acid tetrabutylammoniumsalt (30) | 3,4,3',4'-benzophenonetetracarboxylic dianhydride | 0.79 | 274/— |
| A7 | 4,4'-diamino-3,3'-dimethyl-5,5'-diethyldiphenylmethane (90) | 4,4'-diamino-trans-stilbene-2,2'-disulfonic acid tetrabutylammoniumsalt (10) | 3,4,3',4'-benzophenonetetracarboxylic dianhydride | 0.63 | 303/— |
| A8 | 4,4'-diamino-biphenyl-2,2'-disulfonic acid di-tetrabutylammoniumsalt (10) | 4,4'-diamino-3,3'-diethyl-5,5'-dimethyldiphenylmethane (90) | 3,4,3',4'-benzophenonetetracarboxylic dianhydride (100) | 0.553 | 311/— |
| A9 | 4,4'-diamino-trans-stilbene-2,2'-disulfonic acid di-tetrabutyl-ammonium salt (20) | 4,4'-diamino-3,3'-diethyl-5,5'-dimethyldiphenylmethane (80) | 2,4-bis(phthalic anhydrid-4-carbonyl)benzoic acid (100) | 0.170 | 227/— |
| A10 | 4,4'-diamino-trans-stilbene-2,2'-disulfonic acid di-tetrabutyl-ammonium salt (20) | 4,4'-diamino-3,3'-diethyl-5,5'-dimethyldiphenylmethane (80) | 4-(pyromelliic dianhydride-3'-carbonyl)-benzophenone (100) | 0.387 | — |
| A11[5] | 4,4'-diamino-trans-stilbene-2,2'-disulfonic acid di-tetrabutyl-ammonium salt (10) | 4,4'-diamino-3,3'-diethyl-5,5'-dimethyldiphenylmethane (90) | bicyclo[2.2.2]oct-7-ene-2,3,5,6-tetra-carboxylic dianhydride (20) | 0.162 | — |
| A12[6] | 4,4'-diamino-trans-stilbene-2,2-disulfonic acid di-tetrabutyl-ammonium salt (10) | 2,4,6-trimethyl-m-phenylenediamine (90) | diethylenetriamine pentacetic dianhydride (10) | 0.373 | — |
| A13[6] | 4,4'-diamino-trans-stilbene-2,2'-disulfonic acid di-tetrabutyl-ammonium salt (10) | 4,4'-diamino-3,3'-diethyl-5,5'-dimethyldiphenylmethane (90) | diethylenetriamine pentacetic dianhydride (10) | 0.386 | — |
| A14[6] | 3,5-diamino-2,4,6-trimethyl-1-sulfonic acid tetrabutylammonium salt (20) | 4,4'-diamino-3,3'-diethyl-5,5'-dimethyldiphenylmethane (80) | tetrahydrofuran-2,3,4,5,-tetracarboxylic dianhydride (10) | 0.873 | 300/— |

[1] based on the diamines
[2] 0.5 percent by weight in N-methylpyrrolidone, 25° C.
[3] glass transition temperature (differential scanning calorimetry)
[4] melting point (differential scanning calorimetry)
[5] 2-tetracarboxylic dianhydride: 80 mol % of 3,4,3',4'-benzophenonetetracarboxylic dianhydride
[6] 2-tetracarboxylic dianhydride: 90 mol % of 3,4,3',4'-benzophenonetetracarboxylic dianhydride

B) PERMEATION EXPERIMENTS

Examples B1 to B7

The membrane (diameter 4.7 cm, thickness 25 μm) is secured in a support in the centre of a pressure cell. Each compartment is connected to a reservoir for the solution or pure solvent to which a pump is connected. Conductivity cells are positioned between reservoirs and pumps, and UV detectors are positioned between outlet and reservoirs. A pressure of 2.5 MPa is applied on the side with the solution and a pressure of 0.3 MPa on the side with the solvent, and both the solution and the solution circulate in the same direction. The detectors measure the conductivity and UV absorption continuously. The data are evaluated by means of a computer program. The detectors are calibrated with the organic compound (methyl cinnamate) and with the salt of the carboxylic acid (lithium salt of cinnamic acid), and the calibration curves are converted into algorithms from which the desired data are computed. Methanol is used as solvent and the UV detection is carried out at 305 nm. The temperature is 25° C.

The selctivity is defined as follows, $G^P$ being the amount by weight in the permeate and $G^L$ the amount by weight in the solution:

$$S = \frac{G^P \text{ (nonpolar organic compound)}/G^P \text{ (salt of the carboxylic acid)}}{G^L \text{ (nonpolar organic compound)}/G^L \text{ (salt of the carboxylic acid)}}$$

Further particulars are given in Table 2.

TABLE 2

| Example | Copolyimide of Example | Permeation rate (mg · min$^{-1}$ · cm$^{-2}$) | Amounts at start of experiment[1] | | Duration of experiment (min) | Permeated amounts at end of experiment | | Selectivity |
|---|---|---|---|---|---|---|---|---|
| | | | methyl cinnamate (mg) | lithium cinnamate (mg) | | methyl cinnamate (mg) | lithium cinnamate (mg) | |
| B1 | A5 | 1.220 | 25 | 25 | 3780 | 6.40 | 1.69 | 3.80 |
| B2 | A6 | 0.617 | 25 | 25 | 3060 | 2.71 | 0.32 | 8.38 |
| B3 | A7 | 0.228 | 25 | 25 | 4050 | 0.51 | 0.14 | 3.64 |
| B4 | A8 | 0.095 | 75[2] | 75[3] | 1020 | 0.240[2] | 0.024[3] | 10.0 |
| B5 | A8 | 0.095 | 25 | 25 | 3060 | 0.412 | 0.130 | 3.2 |
| B6 | A14 | 0.254 | 25 | 25 | 1020 | 0.379 | 0.138 | 2.8 |
| B7 | A14 | 0.254 | 75[4] | 75[5] | 1020 | 2.511[4] | 0.028[5] | 90.3 |

[1] 0.005% by weight
[2] dimethyl phthalate
[3] 35% of trilithium trimellitate and 65% of dilithium trimellitate
[4] methyl benzoate
[5] 98% of dilithium phthalate and 2% of monolithium phthalate

C) EXPOSURE EXAMPLES

Example C1

The copolyimide of Example A3 is dissolved in N-methylpyrrolidone (100% by weight) and a copper laminate is coated with this solution with a 12μ knife (spin-coating) and dried at 100° C. The coating is then exposed through a photomask (Stouffer wedge) for 30 seconds at an intensity of 40 mW/cm$^2$ (Lamp: Ultralux 5000H, distance 70 cm). Development is then carried out with aqueous 1N NaOH. The Stouffer step 7 is still clearly imaged.

Example C2

The copolyimide according to Example A2 is processed as in example C1. The Stouffer step 8 is still clearly imaged.

What is claimed is:

1. A process for the production of relief images, which comprises irradiating a copolyimide layer on a support through a photomask, said copolyimide having an inherent viscosity of 0.2 to 3.0 dl/g, measured at 25° C. in a solution of 0.5% by weight of said process in N-methylpyrrolidone, and comprising A) at least one structural repeating unit of aromatic tetracarboxylic acid radicals (a) which contain 10 to 30 carbon atoms and which are unsubstituted or substituted by halogen, nitro, C$_1$–C$_4$alkyl, C$_1$–C$_4$alkoxy or phenacyl, and aromatic diamine radicals (b) which contain 6 to 30 carbon atoms and which are unsubstituted or substituted by C$_1$–C$_4$alkyl or halogen; and at least one additional optional structural repeating unit of aromatic tricarboxylic acid radicals (c) of 9 to 30 carbon atoms, which radicals are unsubstituted or substituted as for (a), and of identical or different diamine radicals (b), and B) at least one structural repeating unit of identical or different tetracarboxylic acid radicals (a) and aromatic diamines (d) which contain 6 to 30 carbon atoms and which are unsubstituted or substituted by C$_1$–C$_4$alkyl, and which contain at least one —SO$_3$M group attached to the aromatic nucleus, wherein M is H$^\oplus$, a mono- to trivalent metal cation, NH$_4\oplus$ or an organic ammonium cation of 1 to 30 carbon atoms; and additional optional structural repeating units of identical or different aromatic tricarboxylic acid radicals (c) and identical or different diamine radicals (d), with the proviso that at least one of said diamine radicals (b) or (d) is substituted by C$_1$–C$_4$alkyl in both ortho-positions to at least one N atom, and thereafter developing the image so produced in an aqueous alkaline medium by dissolving out the unexposed areas.

2. A process according to claim 1, wherein the diamine radicals (b) are substituted by C$_1$–C$_4$alkyl in both ortho-positions of both N atoms.

3. A process according to claim 1, wherein the diamine radicals (d) are substituted by C$_1$–C$_4$alkyl in both ortho-positions of both N atoms.

4. A process according to claim 1, wherein the diamine radicals (b) and (d) are substituted by methyl or ethyl in both ortho-positions of both N atoms.

5. A process according to claim 1, wherein the copolyimide contains 5 to 95 mol % of component (A) and 95 to 5 mol % of component (B), based on said copolyimide.

6. A process according to claim 5, wherein the copolyimide contains 50 to 95 mol % of component (A) and 50 to 5 mol % of component (B).

7. A process according to claim 1, wherein the copolyimide comprises a) structural units of formula I

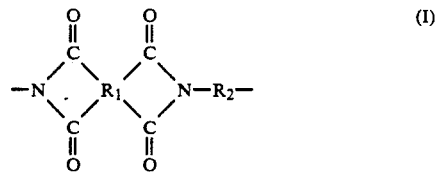

and additional optional structural units of formula II

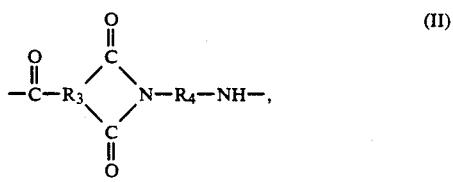

and b) structural units of formula III

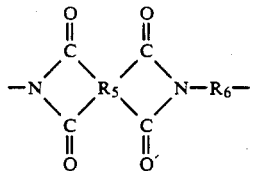

(III)

and additional optional structural units of formula IV

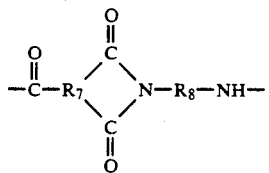

(IV)

wherein
R₁ and R₅ are each independently of the other an unsubstituted or substituted tetravalent aromatic radical of 6 to 20 carbon atoms, to which two of the carbonyl groups in the ortho- or peri-position are attached, R₃ and R₇ are each independently of the other an unsubstituted or substituted trivalent aromatic radical of 6 to 20 carbon atoms, to which two of the carbonyl groups in the ortho- or peri-position are attached, R₂ and R₄ are each independently of the other a divalent aromatic hydrocarbon radical of 6 to 20 carbon atoms which is unsubstituted or substituted by $C_1$–$C_4$alkyl or halogen and R₆ and R₈ are each independently of the other a divalent aromatic hydrocarbon radical of 6 to 20 carbon atoms which is unsubstituted or substituted by $C_1$–$C_4$alkyl and which contains at least one —SO₃M group, wherein M is H⊕, a mono- to trivalent metal cation, NH₄⊕ or an organic ammonium cation of 1 to 30 carbon atoms, with the proviso that the radicals R₂ and R₄ or the radicals R₆ and R₈ or both are substituted by $C_1$–$C_4$alkyl in both ortho-positions to at least one N atom.

8. A process according to claim 7, wherein R₁ and R₅ are each independently of the other radicals of the formulae

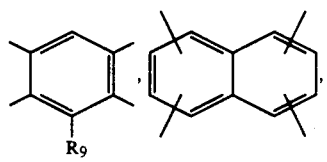

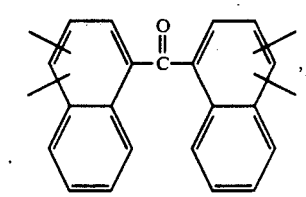

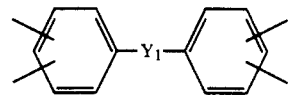

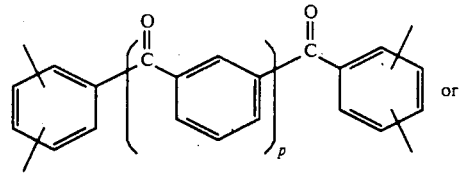

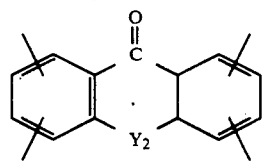

wherein two bonds are in the ortho-position to each other, R₉ is H or phenacyl, Y₁ is a direct bond or is —CH₂—, —CH(CH₃)—, —C(CH₃)₂—, —O—, —S—, —SO—, —SO₂—, —C(O)O— or —NR₁₀—, p is 0 or 1, Y₂ is —CH₂—, —CH(CH₃)—, —C(CH₃)₂—, —O—, —S—, —SO—, —SO₂—, —CO— or —NR₁₀—, and R₁₀ is H or $C_1$–$C_6$alkyl.

9. A process according to claim 7, wherein R₁ and R₅ are each independently of the other radicals of the formulae

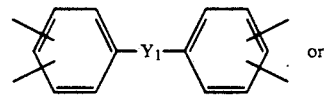

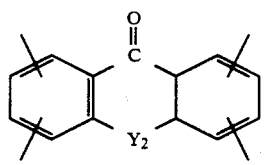

wherein two bonds are in the ortho-position to each other, Y₁ is a direct bond or is —CH₂—, —O—, —S— or —SO₂—, and Y₂ is a direct bond, —O—, —S— or —CO—.

10. A process according to claim 7, wherein R₃ and R₇ are each independently of each other radicals of the formulae

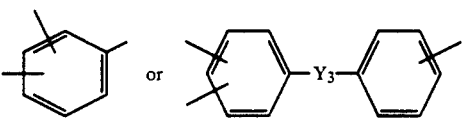

wherein two bonds are attached in the ortho-position to each other, and Y₃ is a direct bond or is —S—, —O—, —CH₂— or —CO—.

11. A process according to claim 7, wherein the tetracarboxylic acid radicals $R_1$ and $R_5$ and the tricarboxylic acid radicals $R_3$ and $R_7$ contain a benzophenone group.

12. A process according to claim 7, wherein $R_2$, $R_4$, $R_6$ and $R_8$ are each independently of the other a phenylene, naphthylene or an unbridged or bridged biphenylene radical.

13. A process according to claim 7, wherein $R_2$ and $R_4$ are each independently of the other an unsubstituted or a chloro-, bromo- or $C_1$-$C_4$alkyl-substituted radical of the formulae

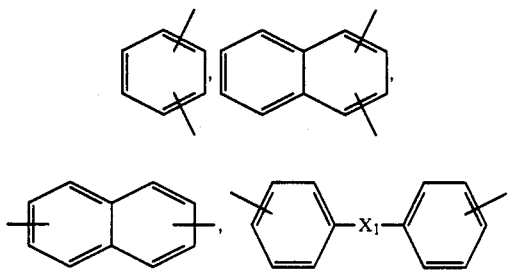

wherein
$X_1$ is a direct bond or is —CH$_2$—, —(CH$_2$)$_2$—, —HC=CH—, CH$_3$CH<, (CH$_3$)$_2$C<, —NR$_{10}$—, —N=N—, —CO—, —O—, —S—, —SO— or —SO$_2$, and $R_{10}$ is H or $C_1$-$C_6$alkyl, and $R_6$ and $R_8$ each independently of the other is a radical of the formulae

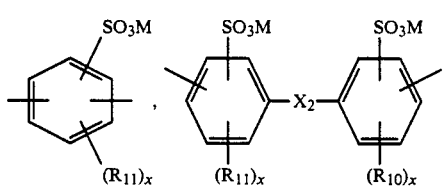

wherein $X_2$ independently has the same meaning as $X_1$, $R_{11}$ is $C_1$-$C_4$alkyl, x is 0, 1, 2 or 3, and M is H⊕, NH$_4$⊕, an alkali metal cation or a primary, secondary, tertiary or quaternary ammonium cation of 1 to 24 carbon atoms.

14. A process according to claim 13, wherein the copolyimide comprises structural units of the formulae I and III, and $X_1$ and $X_2$ are each independently of the other a direct bond or are —CH$_2$—, —CH=CH—, —CO—, —O— or —S—.

15. A process according to claim 7, wherein the copolyimide comprises structural units of the formulae I and III, wherein $R_1$ and $R_5$ are each independently of the other a tetravalent radical of the benzene series which is unsubstituted or substituted by phenacyl, —NO$_2$—, —Cl or —Br, or a radical of the formula

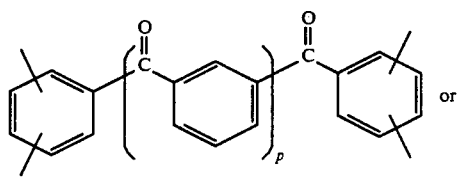

-continued

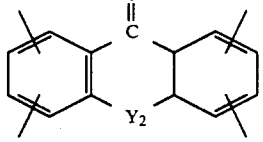

wherein p is 0 or 1 and $Y_2$ is a direct bond or is —CH$_2$—, —S—, —O— or —CO—, $R_2$ in both ortho-positions to at least one amino group is methyl- or ethyl-substituted 1,3- or 1,4-phenylene, or in both o-positions to the amino groups is methyl- or ethyl-substituted 3,3'- or 4,4'-diphenylmethanediyl, and $R_6$ is a radical of the formulae

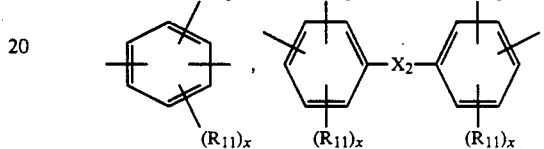

wherein $X_2$ is a direct bond or is —CH=CH— or —CH$_2$—, $R_{11}$ is methyl or ethyl, x is 0, 1, 2 or 3, and M is H⊕, NH$_4$⊕, Li⊕, Na⊕, K⊕, Rb⊕, Cs⊕, or primary, secondary, tertiary or quaternary ammonium of 1 to 20 carbon atoms.

16. A process according to claim 15, wherein $R_6$ is a radical of the formulae

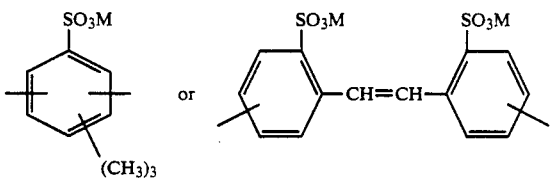

wherein M is H⊕, NH$_4$⊕, Li⊕, Na⊕, K⊕, Rb⊕, Cs⊕, or tertiary or quaternary ammonium of 4 to 20 carbon atoms.

17. A process according to claim 1, wherein the aqueous alkaline mendium is an aqueous solution of alkali metal hydroxides or alkali metal carbonates.

18. A process according to claim 17, wherein the hydroxide is NaOH or KOH and the carbonate is Na$_2$CO$_3$, K$_2$CO$_3$, NaHCO$_3$ or KHCO$_3$.

19. A process for the production of a protective layer, which comprises irradiating a copolyimide layer on a support, said copolyimide having an inherent viscosity of 0.2 to 3.0 dl/g, measured at 25° C. in a solution of 0.5% by weight of said copolyimide in N-methylpyrrolidone, and comprising
A) at least one structural repeating unit of aromatic tetracarboxylic acid radicals (a) which contain 10 to 30 carbon atoms and which are unsubstituted or substituted by halogen, nitro, $C_1$-$C_4$alkyl, $C_1$-$C_4$alkoxy or phenacyl, and aromatic diamine radicals (b) which contain 6 to 30 carbon atoms and which are unsubstituted or substituted by $C_1$-$C_4$alkyl or halogen; and at least one additional optional structural repeating unit of aromatic tricarboxylic acid radicals (c) of 9 to 30 carbon atoms, which radicals are unsubstituted or substituted as for (a), and of identical or different diamine radicals (b), and B) at least one structural repeating unit of identical or different tetracarboxylic acid radicals (a) and aromatic diamines (d) which contain 6 to 30 carbon atoms and which are unsubstituted or substituted by $C_1$–$C_4$alkyl, and which contain at least one —$SO_3M$ group attached to the aromatic nucleus, wherein M is $H^\oplus$, a mono- to trivalent metal cation, $NH_4^\oplus$ or an organic ammonium cation of 1 to 30 carbon atoms; and additional optional structural repeating units of identical or different aromatic tricarboxylic acid radicals (c) and identical or different diamine radicals (d), with the proviso that at least one of said diamine radicals (b) or (d) is substituted by $C_1$–$C_4$alkyl in both ortho-positions to at least one N atom.

* * * * *